United States Patent
Liu et al.

(10) Patent No.: US 12,418,082 B2
(45) Date of Patent: Sep. 16, 2025

(54) PHASE SHIFTER, ELECTRICALLY REGULATED ANTENNA, NETWORK DEVICE, AND PHASE SHIFTER MANUFACTURING METHOD

(71) Applicant: ZTE Corporation, Shenzhen (CN)

(72) Inventors: Liang Liu, Shenzhen (CN); Yulong Kang, Shenzhen (CN); Lijun Yang, Shenzhen (CN); Feng Yang, Shenzhen (CN); Lei Chen, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 172 days.

(21) Appl. No.: 17/766,548

(22) PCT Filed: May 28, 2020

(86) PCT No.: PCT/CN2020/092760
§ 371 (c)(1),
(2) Date: Apr. 5, 2022

(87) PCT Pub. No.: WO2021/068512
PCT Pub. Date: Apr. 15, 2021

(65) Prior Publication Data
US 2024/0055742 A1    Feb. 15, 2024

(30) Foreign Application Priority Data

Oct. 10, 2019   (CN) .......................... 201910453714.0

(51) Int. Cl.
*H01P 1/18*      (2006.01)
*H01Q 1/24*      (2006.01)
(Continued)

(52) U.S. Cl.
CPC .............. *H01P 1/182* (2013.01); *H01P 1/184* (2013.01); *H01Q 1/246* (2013.01); *H01Q 3/32* (2013.01); *H05K 9/0081* (2013.01)

(58) Field of Classification Search
CPC .. H01P 1/18; H01P 1/184; H01P 1/182; H01P 11/001; H01P 11/003; H01Q 3/22; H01Q 1/246
See application file for complete search history.

(56) References Cited

U.S. PATENT DOCUMENTS

| | | | |
|---|---|---|---|
| 4,862,120 A * | 8/1989 | Ruxton | ...................... H01P 5/08 333/34 |
| 2016/0013532 A1 | 1/2016 | Iso | |
| 2017/0005387 A1 | 1/2017 | Hsu | |

FOREIGN PATENT DOCUMENTS

| | | |
|---|---|---|
| CN | 1558468 A | 12/2004 |
| CN | 103904431 A | 7/2014 |

(Continued)

OTHER PUBLICATIONS

International Search Report for corresponding application PCT/CN2020/092760 filed May 28, 2020; Report dated Aug. 21, 2020.
(Continued)

*Primary Examiner* — Stephen E. Jones
(74) *Attorney, Agent, or Firm* — CANTOR COLBURN LLP

(57) ABSTRACT

A phase shifter, an electrically regulated antenna, a network device, and a phase shifter manufacturing method are provided. The phase shifter includes: a shielding member, and an adjustable dielectric layer provided in a shielding space formed by the shielding member; the adjustable dielectric layer includes a line layer and a dielectric member. The line layer includes a feed circuit and an empty slot arranged corresponding to the feed circuit and used to form an air strip line. The dielectric member is inserted into the empty slot,
(Continued)

and a dielectric constant of the feed circuit is changed by controlling a depth of the dielectric member inserted into the empty slot.

16 Claims, 7 Drawing Sheets

(51) Int. Cl.
  *H01Q 3/32* (2006.01)
  *H05K 9/00* (2006.01)

(56) References Cited

FOREIGN PATENT DOCUMENTS

| | | |
|---|---|---|
| CN | 107181062 A | 9/2017 |
| CN | 207368177 U | 5/2018 |
| CN | 109509939 A | 3/2019 |
| CN | 109638391 A | 4/2019 |
| CN | 109713405 A | 5/2019 |
| EP | 2802036 A1 | 11/2014 |

OTHER PUBLICATIONS

European Search Report for correponding application EP20875599; Report dated Oct. 21, 2022.

\* cited by examiner

PHASE SHIFTER, ELECTRICALLY REGULATED ANTENNA, NETWORK DEVICE, AND PHASE SHIFTER MANUFACTURING METHOD

CROSS REFERENCE

The present disclosure is a National Stage Filing of PCT International Application No. PCT/CN2020/092760 filed on May 28, 2020, which claims priority to Chinese Application No. 201910453714.0 filed on Oct. 10, 2019, the entirety of which is herein incorporated by reference.

TECHNICAL FIELD

The present disclosure relates, but is not limited, to the technical field of communications, specifically relates, but not limited, to a phase shifter, an electrically regulated antenna, a network device, and a phase shifter manufacturing method.

BACKGROUND

Electrically down-tilt antennas are more and more commonly and necessarily applied in base stations. As a core component of an electrically regulated antenna, the performance of a phase shifter directly determines the performance of an electrically regulated antenna of a base station, which in turn affects the coverage capability of a cellular network of the base station. A phase shifter for an electrically regulated antenna in the related art is basically implemented in two modes, namely, changing a physical length of a transmission line and changing a dielectric constant of the transmission line. The phase shifter implemented in the latter mode is called a dielectric phase shifter.

With the development of communication technologies, electrically regulated antennas start to be applied in the 5th-generation (5G) era. The 5G large-scale electrically regulated antenna array has higher requirements for phase shifters. For example, multi-channel phase shifters are required to be used together, so phase shifters are required to be small in size, thin, light in weight, and simplified in feed circuits as much as possible.

As shown in FIG. 1, a dielectric phase shifter 10 in the related art is usually placed in a dielectric layer in a large metal housing, and the dielectric layer covers, with a dielectric layer in between, upper and lower sides of a circuit board and is able to move left and right to achieve the phase change of the phase shifter. Furthermore, cables 151 to 156 are led out from a side of the phase shifter and are connected to a vibrator unit (also referred to as an oscillator unit, not shown). However, the phase shifter has problems of large thickness and large volume, and the metal shell makes the phase shifter heavier. The phase shifter is no longer suitable for the application of the 5G large-scale array electrically regulated antennas.

Therefore, providing a phase shifter that is small in size, thin, light in weight, and simplified in a feed line as much as possible is very important to the current application of the 5G electrically regulated antennas.

SUMMARY

In an embodiment of the present disclosure, a phase shifter is provided to solve the above-mentioned technical problems. The phase shifter includes: a shielding member, and an adjustable dielectric layer arranged in a shielding space formed by the shielding member. The adjustable dielectric layer includes a line layer and a dielectric member; the line layer includes a feed circuit and an empty slot arranged corresponding to the feed circuit and used to form an air strip line; the dielectric member is inserted into the empty slot; and a dielectric constant of the feed circuit is changed by controlling a depth of the dielectric member inserted into the empty slot.

In another embodiment of the present disclosure, an electrically regulated antenna is further provided. The electrically regulated antenna includes: at least one radiation unit and the phase shifter provided by the embodiment of the present disclosure. The radiation unit is connected to the feed circuit in the phase shifter through a lead wire hole of the phase shifter; the phase shifter changes a phase of an output signal by controlling the depth of the dielectric member inserted into the empty slot; and the output signal after the change of the phase is transmitted through the radiation unit.

In another embodiment of the present disclosure, a network device is further provided. The network device includes a processor, a communication bus, and the electrically regulated antenna provided in the embodiment of the present disclosure. The electrically regulated antenna is configured to change a phase of an output signal and transmit the output signal after the change of the phase; the communication bus is configured to implement connection and communication between the processor and the electrically regulated antenna; and the processor is configured to control the electrically regulated antenna to change the phase of the output signal.

In another embodiment of the present disclosure, a phase shifter manufacturing method is further provided. The phase shifter manufacturing method includes: etching a setting surface of a feed circuit arranged on a printed circuit board (PCB) substrate to form a groove that has a same shape as that of the feed circuit, and respectively etching two setting surfaces of the PCB substrate to form empty slots used to accommodate a dielectric member; attaching the feed circuit into the etched groove; respectively adhering and fixing metal plates or PCBs on the two setting surfaces of the PCB substrate, forming a run-through lead wire through hole in a position corresponding to the groove, and connecting the lead wire through hole to a corresponding pin of the feed circuit; and respectively inserting the dielectric member into the etched empty slots on the two setting surfaces of the PCB substrate.

In another embodiment of the present disclosure, another phase shifter manufacturing method is further provided. The phase shifter manufacturing method includes: providing a first supporting PCB, a second supporting PCB, a line carrying PCB, a first shielding plate and a second shielding plate, wherein the first shielding plate and the second shielding plate are metal plates or PCBs; arranging a feed circuit on at least one setting surface of the line carrying PCB; forming through slots that have the same shapes as that of the feed circuit and empty slots used to accommodate a dielectric member in the first supporting PCB and the second supporting PCB; forming lead wire through holes in positions, corresponding to the through slots in the first supporting PCB and the second supporting PCB, on the first shielding plate and the second shielding plate; pressing and fixing the first supporting PCB, the second supporting PCB, the line carrying PCB, the first shielding plate, and the second shielding plate together; and respectively inserting the dielectric member into the empty slots in the first supporting PCB and the second supporting PCB.

BRIEF DESCRIPTION OF THE DRAWINGS

The present disclosure is further described below in combination with the accompanying drawings and embodiments. In the drawing.

DETAILED DESCRIPTION

Embodiments of the present disclosure provide a phase shifter, an electrically regulated antenna, a network device and a phase shifter manufacturing method. The phase shifter includes: a shielding member, and an adjustable dielectric layer arranged in a shielding space formed by the shielding member. The adjustable dielectric layer includes a line layer and a dielectric member. The line layer includes a feed circuit and an empty slot arranged corresponding to the feed circuit and used to form an air strip line. The dielectric member is inserted into the empty slot. A dielectric constant of the feed circuit is changed by controlling a depth of the dielectric member inserted into the empty slot. By means of inserting the dielectric member into the empty slot in the line layer and controlling the insertion depth of the dielectric member, the dielectric constant of the feed circuit in the line layer is adjusted, so that the size, thickness and weight of the phase shifter can be further reduced.

In order to make the objectives, the technical solutions, and the advantages of the present disclosure clearer, the embodiments of the present disclosure will be described in detail below in combination through specific implementation modes with the accompanying drawing. It should be understood that the specific embodiments described here are merely to explain the present disclosure, and not intended to limit the present disclosure.

Embodiment I

Figure 1:
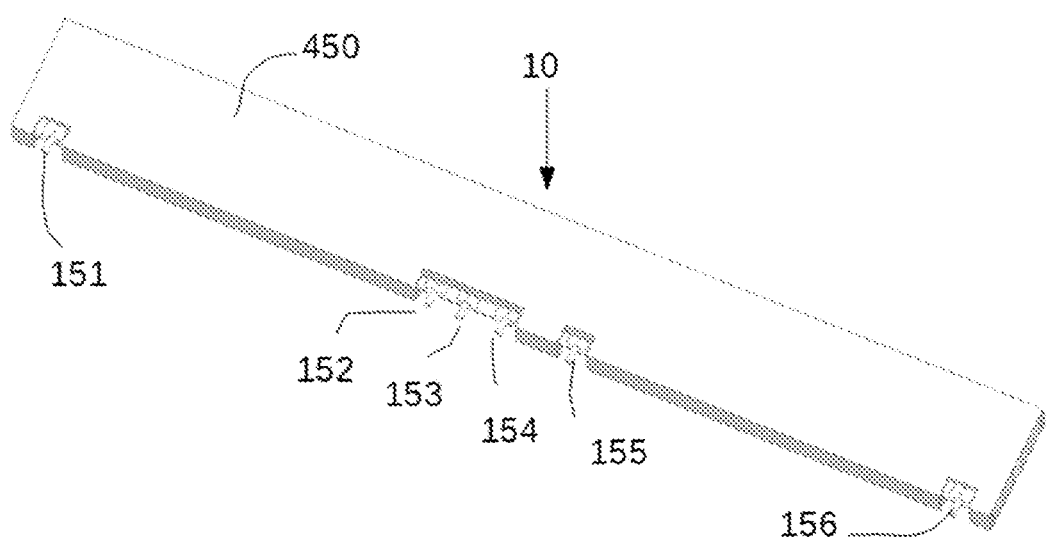
FIG. 1 is a profile diagram of a dielectric phase shifter in the related art.
Figure 2:
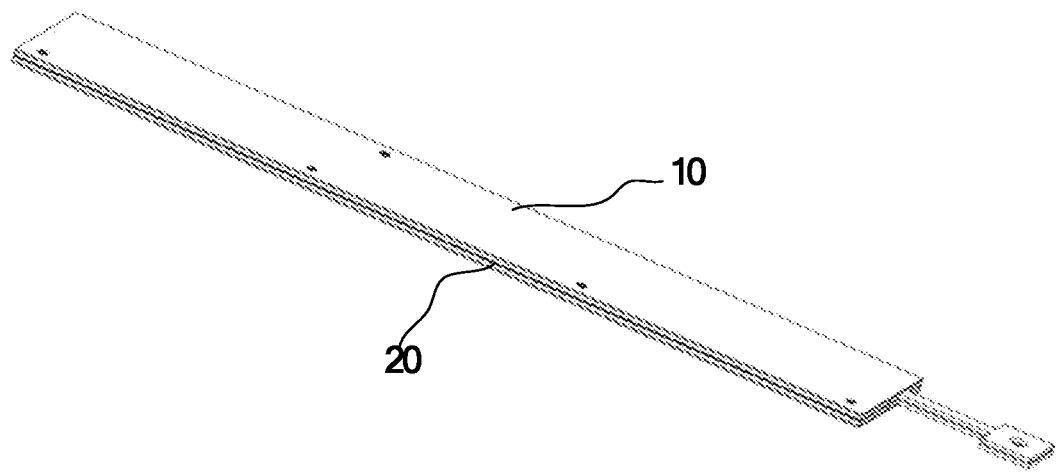
FIG. 2 is a schematic profile diagram of a phase shifter provided by an embodiment of the present disclosure.
Figure 3:
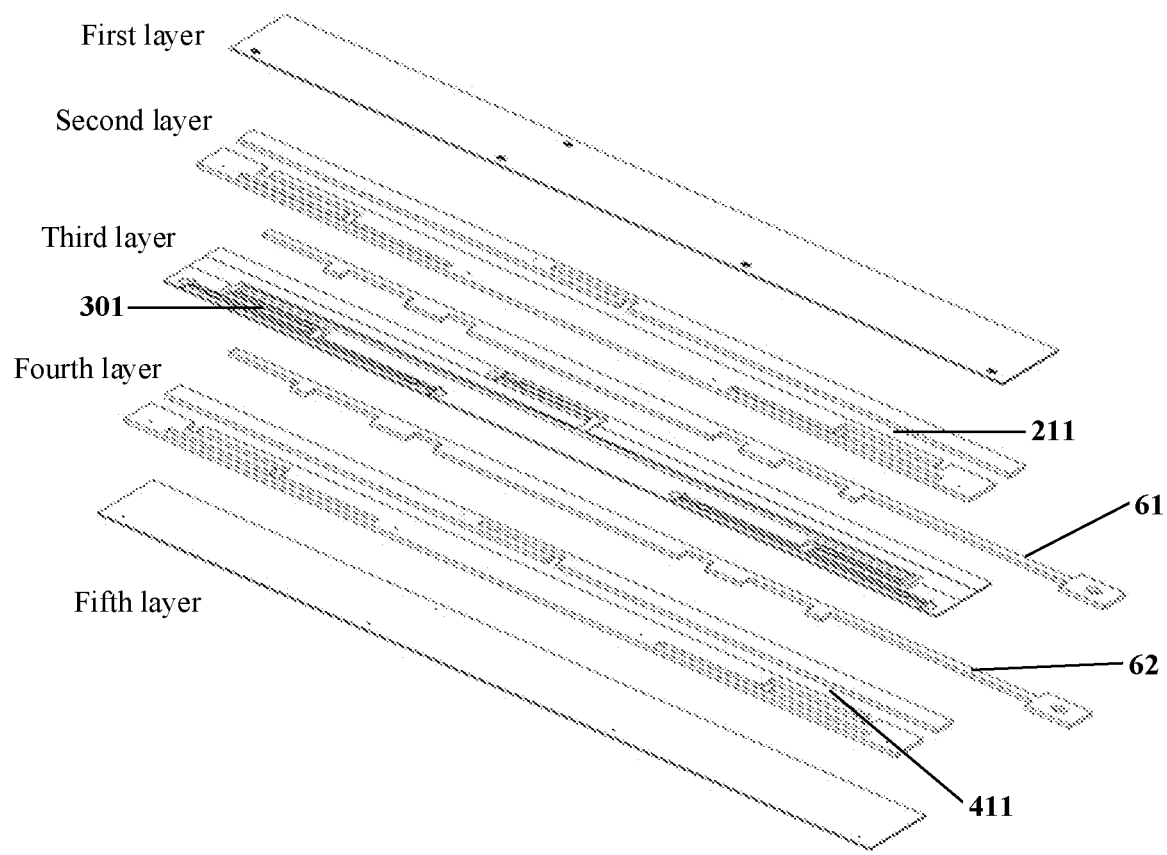
FIG. 3 is a schematic exploded diagram 1 of a phase shifter provided by an embodiment of the present disclosure.

In order to avoid the problems of large thickness, low strength and small adjustable range of a phase shifter with a lateral-sliding type dielectric plate, this embodiment provides a phase shifter. Referring to FIG. 2 and FIG. 3, FIG. 2 is a schematic profile diagram of a phase shifter provided by an embodiment of the present disclosure, and FIG. 3 is an exploded diagram of a phase shifter provided by an embodiment of the present disclosure. The phase shifter includes a shielding member (on a first layer and a fifth layer) and an adjustable dielectric layer arranged in a shielding space formed by the shielding member. The adjustable dielectric layer includes a line layer (on a second layer, a third layer and a fourth layer) and dielectric members 61, 62. The line layer includes a feed circuit 301 and empty slots 211, 411 arranged corresponding to the feed circuit and used to form an air strip line. The dielectric members are inserted into the corresponding empty slots, and the dielectric constant of the feed circuit is changed by controlling the depths (such as insertion lengths in a longitudinal direction of the empty slots) of the dielectric members inserted into the empty slots. The shielding member of the phase shifter provided in this embodiment is a layer of metal housing that covers an outer layer of the phase shifter. The feed circuit inside the phase shifter is separated from the outside through this layer of metal housing, so as to avoid interference. The adjustable dielectric layer of the phase shifter is arranged in the middle of or inside the shielding member. The adjustable dielectric layer can adjust the dielectric constant by changing the insertion depths of the dielectric members to achieve the purpose of changing the phase of the signal. The adjustable dielectric layer includes the line layer and the dielectric members. The line layer is composed of the feed circuit and the empty slots. One layer of air strip line will be formed between the empty slot and the shielding member. The dielectric members are inserted into the empty slots. When the dielectric members are inserted into the empty slots, a medium in the empty slots is changed from air into a dielectric member material. As the medium changes, the dielectric constant of the feed circuit also changes.

In this embodiment, the line layer may include a line carrying plate. The line carrying plate includes at least one line setting surface. The feed circuit is formed on the line setting surface. The line layer further includes a first supporting plate and a second supporting plate which are arranged on two setting surfaces of the line carrying plate. A through slot matched with a shape of the feed circuit formed on the line setting surface corresponding to the first supporting plate and/or the second supporting plate is formed in the first supporting plate and/or the second supporting plate, so that when the carrying plate is fitted to the first supporting plate and/or the second supporting plate, the feed circuit is embedded into the through slot. The carrying plate is provided with two setting surfaces. Each setting surface may be used to attach the line layer, so that the line layer is arranged on one or two setting surfaces of the carrying plate. Two supporting plates, i.e., the first supporting plate and the second supporting plate, are also arranged on the two setting surfaces of the carrying plate. When the feed circuit is arranged on the setting surface of the carrying plate, one through slot that has a same shape as that of the feed circuit needs to be provided on the supporting plate on the setting surface correspondingly provided with the feed circuit, so as to accommodate the feed circuit.

In this embodiment, the first supporting plate is provided with a first empty slot used to form a first air strip line, and the second supporting plate is provided with a second empty slot used to form a second air strip line. In this embodiment, the first supporting plate and/or the second supporting plate further include the empty slots used to form the air strip lines in addition to the through slots that have the same shapes as that of the feed circuit. The first supporting plate corresponds to the first empty slot, and the second supporting plate corresponds to the second empty slot. The air strip lines formed by the first empty slot and the second empty slot are completely the same. The first empty slot may be a strip-shaped slot that completely runs through the first supporting plate, or may be a groove with one side provided with an open hole and the other side closed. The second empty slot may be a strip-shaped slot that completely runs through the second supporting plate, or may be a groove with one side provided with an open hole and the other side closed.

In this embodiment, the dielectric member includes a first dielectric pull rod used to be inserted into the first empty slot and a second dielectric pull rod used to be inserted into the second empty slot. The first dielectric pull rod and the second dielectric pull rod are exactly the same in shape, and the shape is related to a differential ratio of a phase change of an output signal. A first operation end, which is located outside the first empty slot, of the first dielectric pull rod and a second operation end, which is located outside the second empty slot, of the second dielectric pull rod are located at a same end and synchronously move during insertion and withdrawal. In this embodiment, the dielectric members are dielectric pull rods. Since the first empty slot and the second empty slot exist at the same time, the dielectric pull rods also include the first dielectric pull rod and the second dielectric pull rod. When the first dielectric pull rod and the second dielectric pull rod are inserted into the first empty slot and the second empty slot, the dielectric constant of the feed circuit may be adjusted. Therefore, differential ratios of phase changes of different output signals may be achieved by changing the shapes of the first dielectric pull rod and the second dielectric pull rod. In order to achieve a better matching relation between the first dielectric pull rod and the second dielectric pull rod, the first dielectric pull rod and the second dielectric pull rod may have the same shapes. In this embodiment, the first dielectric pull rod and the second dielectric pull rod each include a front-end insertion section and a rear-end operation end. The front-end insertion section is inserted into the empty slot to adjust the dielectric constant, and the rear-end operation end extends out of the empty slot. When it is necessary to adjust the insertion depth of the dielectric pull rod, the insertion depth may be adjusted through the rear-end operation end. For example, electric adjustment can be achieved through a motor, or the adjustment can be achieved manually. Similarly, in order to achieve a better matching relation between the first dielectric pull rod and the second dielectric pull rod, the first dielectric pull rod and the second dielectric pull rod may keep synchronously moving in the insertion and withdrawal processes. In this embodiment, the operation ends of the first dielectric pull rod and the second dielectric pull rod may be fixed together to achieve the synchronous movement. In some other embodiments, a first open hole and a second open hole may also be formed in the operation ends of the first dielectric pull rod and the second dielectric pull rod. During use, the first open hole and the second open hole are fixed together through a bolt for synchronous movement.

In the phase shifter of the related art, since a dielectric plate is arranged on a side surface of the phase shifter, a signal input wire and a signal output wire of the phase shifter are both led out from the side surface of the phase shifter. This leads to an increase in the thickness and weight of the phase shifter. In this embodiment, the shielding member is a shielding housing forming a shielding space. A lead wire through hole is formed in a housing surface, parallel to a plane where the feed circuit is located, on the shielding housing. The lead wire through hole is connected to a pin of the feed circuit. In this embodiment, the feed circuit is completely wrapped inside the shielding member, so that an input lead wire and an output lead wire of the feed circuit are both led out through the lead wire through hole in the shielding member. One layer of supporting plate is further arranged between the shielding member and the feed circuit, and a through slot that is the same as the feed circuit is formed in the supporting plate, so that in some embodiments, the position of the lead wire through hole may be set corresponding to an input pin and an output pin of the feed circuit, so as to reduce a length of a lead wire for connecting the lead wire through hole to the pin of the feed circuit.

In this embodiment, in order to reduce the complexity of a manufacturing process and the manufacturing difficulty, the shielding member includes the first shielding plate and the second shielding plate. The first shielding plate and the second shielding plate are covered above and below the dielectric layer. A shielding space may be formed between the first shielding plate and the second shielding plate. The shielding member is mainly to shield electromagnetic interference, so that the first shielding plate and the second shielding plate can be directly made of metal plates or PCBs. At least one surface of the PCB is covered with a metal layer.

In this embodiment, in order to further reduce the thickness and weight of the phase shifter, the line carrying plate, the first supporting plate and the second supporting plate are all made into PCBs. In a case where the first shielding plate and the second shielding plate are PCBs, the line carrying plate, the first supporting plate, the second supporting plate, the first shielding plate and the second shielding plate are pressed to each other to form the phase shifter. In addition, in a case where the first shielding plate and the second shielding plate are metal plates, the line carrying plate, the first supporting plate and the second supporting plate are pressed to each other, and the first shielding plate and the second shielding plate are respectively fixed on the first supporting plate and the second supporting plate to form the phase shifter.

This embodiment provides a phase shifter. The phase shifter includes a shielding member, and an adjustable dielectric layer arranged in a shielding space formed by the shielding member. The adjustable dielectric layer includes a line layer and a dielectric member. The line layer includes a feed circuit and an empty slot arranged corresponding to the feed circuit and used to form an air strip line. The dielectric member is inserted into the empty slot. A dielectric constant of the feed circuit is changed by controlling a depth of the dielectric member inserted into the empty slot. The dielectric constant of the feed circuit is adjusted by inserting the dielectric member into the empty slot in the dielectric layer, which reduces the thickness and weight of the phase shifter.

Further, the shielding member and the adjustable dielectric layer in the phase shifter in this embodiment are both made of the PCBs or the metal plates, and the lead wire is led out from the lead wire through hole of the shielding member. By the adoption of the PCB for fabrication and the change of the lead-out position of the lead wire in the above way, the thickness and weight of the phase shifter can be further reduced.

Embodiment II

This embodiment provides an electrically regulated antenna. The electrically regulated antenna includes at least one radiation unit and the phase shifter provided by Embodiment I. The radiation unit is connected to the feed circuit in the phase shifter through a lead wire hole of the phase shifter. The phase shifter changes a phase of an output signal by controlling the depth of the dielectric member inserted into the empty slot. The output signal after the change of the phase is transmitted through the radiation unit. The radiation unit is fixed on the shielding member of the phase shifter. It can be understood that in this embodiment, the function of the radiation unit is to transmit the output signal, therefore the number of radiation units may be set according to an actual situation. Meanwhile, the electrically regulated antenna is provided with the phase shifter provided in Embodiment I. The shielding member on the outermost layer is metal, so that the radiation unit can be directly fixed on the shielding member of the phase shifter. In some other embodiments, the radiation unit is separately arranged at other positions. It is also feasible to connect the phase shifter through a lead wire.

Figure 4:
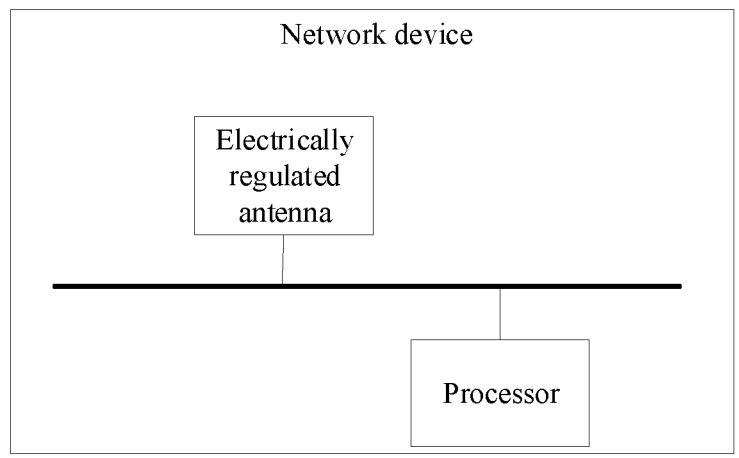
FIG. 4 is a schematic structural diagram of a network device provided by an embodiment of the present disclosure.

This embodiment further provides a network device, referring to FIG. 4. The network device includes a processor, a communication bus and the above-mentioned electrically regulated antenna. The electrically regulated antenna is configured to change a phase of an output signal and transmit the output signal after the change of the phase. The communication bus is configured to implement connection and communication between the processor and the electrically regulated antenna. The processor is configured to control the electrically regulated antenna to change the phase of the output signal.

Embodiment III

Figure 5:
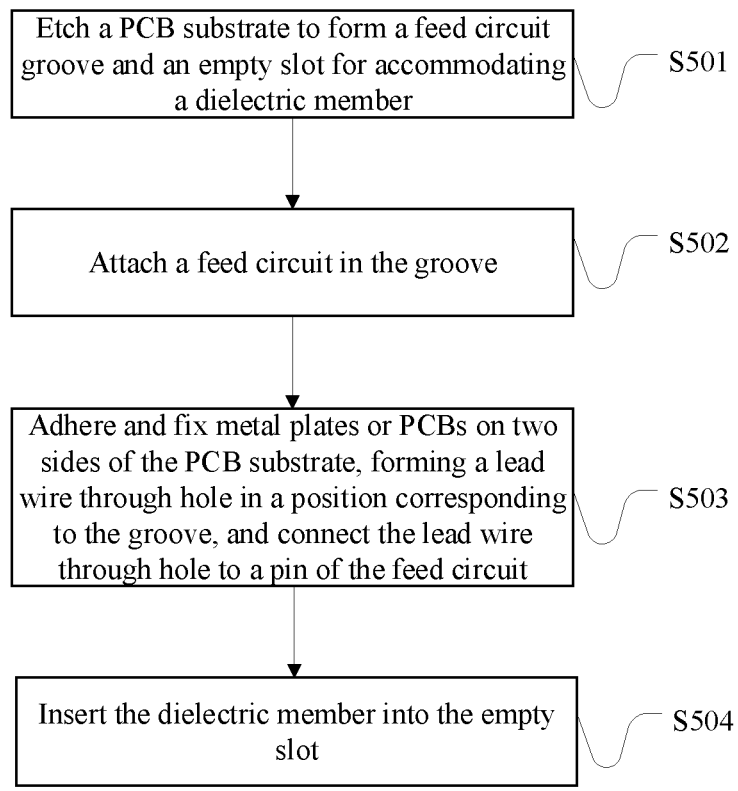
FIG. 5 is a schematic diagram of a phase shifter manufacturing method provided by an embodiment of the present disclosure.

This embodiment provides a phase shifter manufacturing method, referring to FIG. 5. The phase shifter manufacturing method includes operations S501 to S504.

At S501, a PCB substrate is etched to form a feed circuit groove and an empty slot for accommodating a dielectric member.

A setting surface, provided with a feed circuit, on the PCB substrate is etched to form a groove that has a same shape as that of the feed circuit, and two setting surfaces of the PCB substrate are respectively etched to form empty slots used to accommodate dielectric members.

At S502, the feed circuit is attached in the groove.

The feed circuit is attached in the etched groove.

At S503, metal plates or PCBs are adhered and fixed on two sides of the PCB substrate, and a lead wire through hole is formed in a position corresponding to the groove and is connected to a pin of the feed circuit.

The metal plates or PCBs are respectively adhered and fixed on the two setting surfaces of the PCB substrate, and the run-through lead wire through hole is formed in the position corresponding to the groove. The lead wire through hole is connected to the corresponding pin of the feed circuit.

At S504, dielectric members are inserted into the empty slots.

The dielectric members are respectively inserted into the etched empty slots on the two setting surfaces of the PCB substrate.

Figure 6:
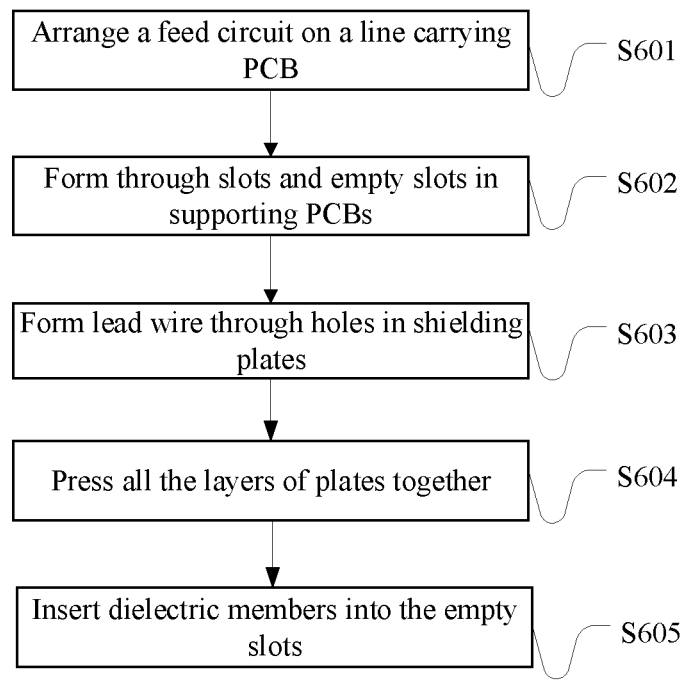
FIG. 6 is a schematic diagram of another phase shifter manufacturing method provided by an embodiment of the present disclosure.

This embodiment further provides another phase shifter manufacturing method, referring to FIG. 6. The phase shifter in this embodiment includes a first supporting PCB, a second supporting PCB, a line carrying PCB, a first shielding plate, and a second shielding plate. The first shielding plate and the second shielding plate are metal plates or PCBs. The phase shifter manufacturing method includes the following operations S601 to S605.

At S601, the feed circuit is arranged on the line carrying PCB.

The feed circuit is arranged on at least one setting surface of the line carrying PCB.

At S602, through slots and empty slots are formed in the supporting PCBs.

The through slots that have the same shapes as that of the feed circuit and the empty slots used to accommodate the dielectric members are formed in the first supporting PCB and the second supporting PCB.

At S603, a lead wire through hole is formed in a shielding plate.

Lead wire through holes are formed in positions, corresponding to the through slots on the first supporting PCB and the second supporting PCB, on the first shielding plate and the second shielding plate.

At S604, all the layers of plates are pressed together.

The first supporting PCB, the second supporting PCB, the line carrying PCB, the first shielding plate, and the second shielding plate are pressed and fixed together.

At S605, dielectric members are inserted into the empty slots.

The dielectric members are respectively inserted into the empty slots in the first supporting PCB and the second supporting PCB.

Embodiment IV

This embodiment takes a phase shifter made of a PCB as an example. An ultra-thin dielectric phase shifter implemented on the basis of a PCB form is provided. Referring to FIG. 3, the phase shifter is formed by integrally pressing 5 layers of low-cost PCBs or 3 layers of PCBs, and the layers of PCBs are welded on the upper and lower sides by using metal sheets or double-faced metal PCBs to form one piece. The third layer is a PCB line layer. The second layer and the fourth layer on the upper and lower sides of the line are dielectric supporting layers. The second layer and the fourth layer at the upper and lower parts of a line region are hollowed out to form air strip lines, which can reduce the line loss. Dielectric sheets 61, 62 move in the hollowed-out regions to achieve phase changes. The first and fifth layers of PCBs (or metal sheets) are shielding layers of the phase shifter.

The dielectric plate of this phase shifter slides in a cavity of the phase shifter, so that a PCB circuit in the cavity achieves conversion between a dielectric strip line and an air strip line due to changes between dielectric and air, thus obtaining linear changes of a phase. The dielectric phase shifter has the characteristics of low design tolerance sensitivity, low loss, good performance and the like since a transmission line itself is not changed.

One multi-path phase shifter of the embodiment of the present disclosure is achieved by integrally pressing multiple layers of PCBs. The line region contains the air-like strip lines, which can achieve low loss. Metal vias are used around the line for shielding to form strip lines or coaxial-like structures. The lines may be matched by adopting micro quarter wavelength impedance or gradient transmission line impedance or other forms. Mediums at the upper and lower layer ends of the line are slotted, so that a medium sliding rod can move in the slots to achieve conversion of mode phases between the air strip line and a dielectric strip line. Dielectric pull rods are matched in a manner of partially slotting two ends. The line layer can be integrated with a feed circuit, and an end outlet can be directly connected to a radiator. The entire phase shifter does not need to be assembled. An important improvement is to reduce the thickness and weight of the phase shifter. The weight is less than ⅓ of that of the phase shifter in the related art, and the thickness can be less than 3 mm.

Embodiment V

Figure 7:
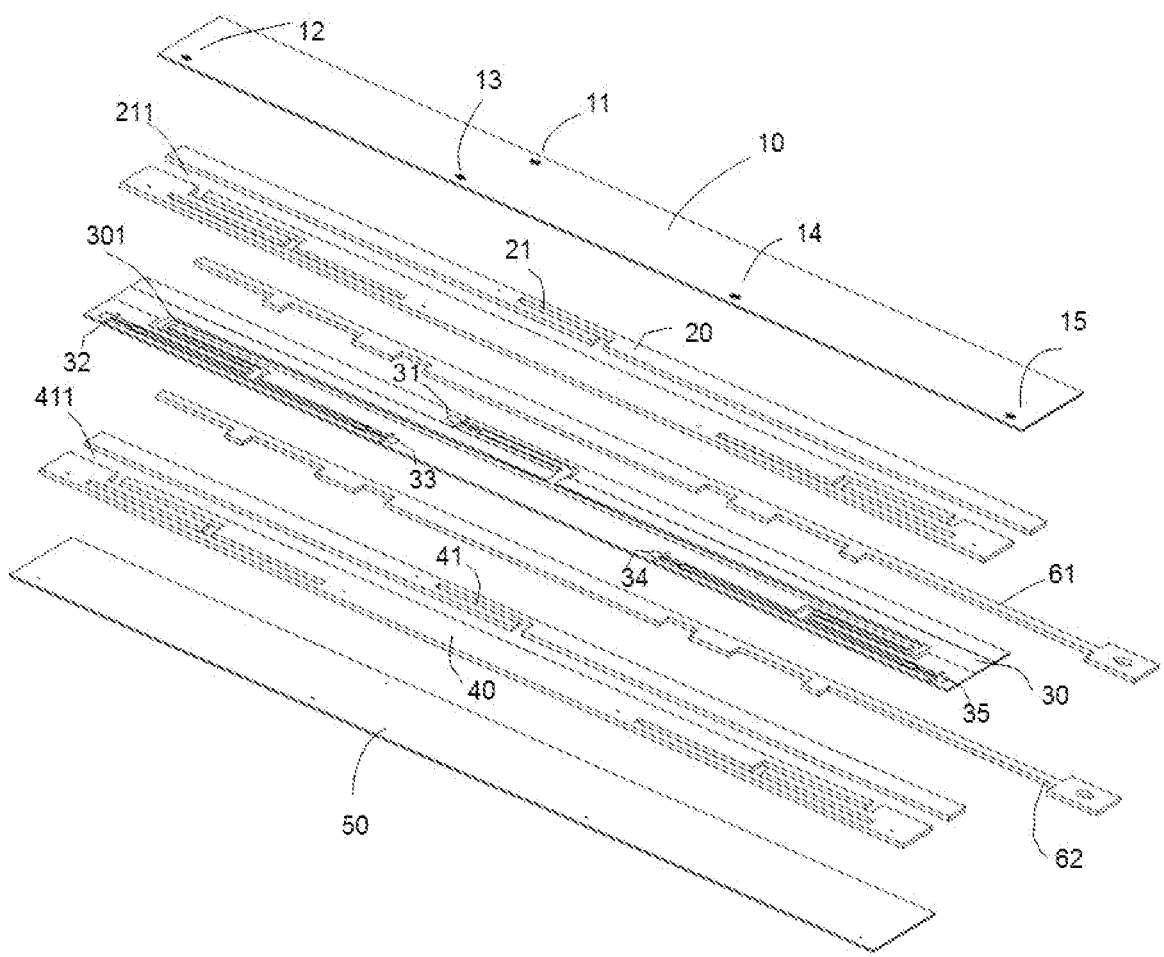
FIG. 7 is a schematic exploded diagram 2 of a phase shifter provided by an embodiment of the present disclosure.
Figure 10:
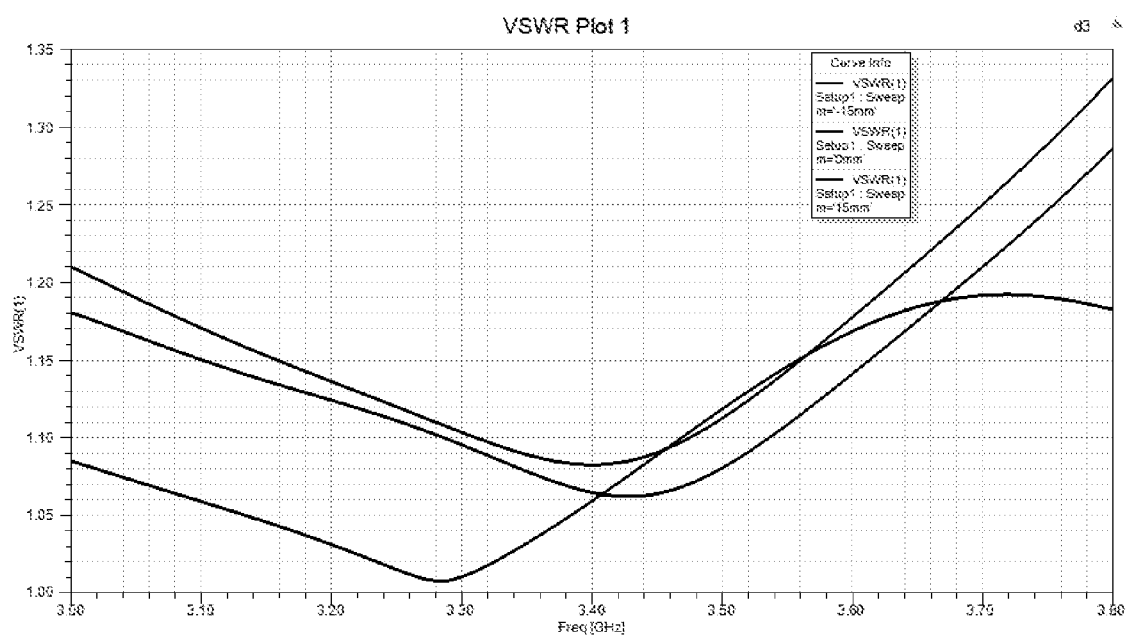
FIG. 10 is a schematic diagram of standing-wave characteristics of different phase shift positions of a phase shifter provided by Embodiment V of the present disclosure at an input port 11.
Figure 11:
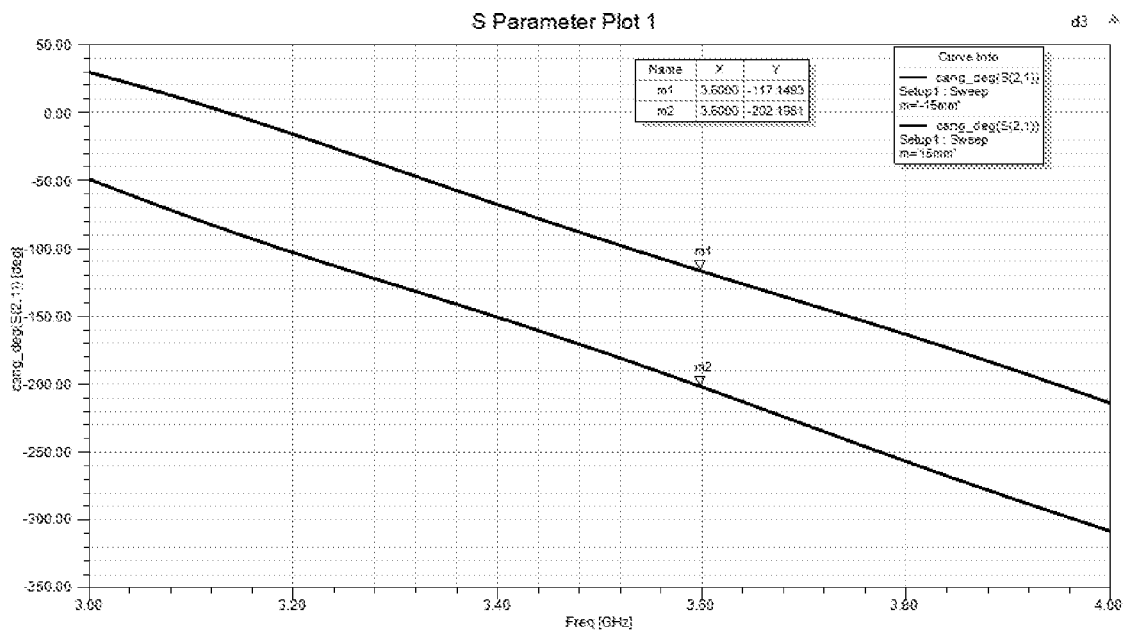
FIG. 11 is a schematic diagram of phase shift characteristics of different phase shift positions of a phase shifter provided by Embodiment V of the present disclosure from an input port 11 to an output port 12.
Figure 12:
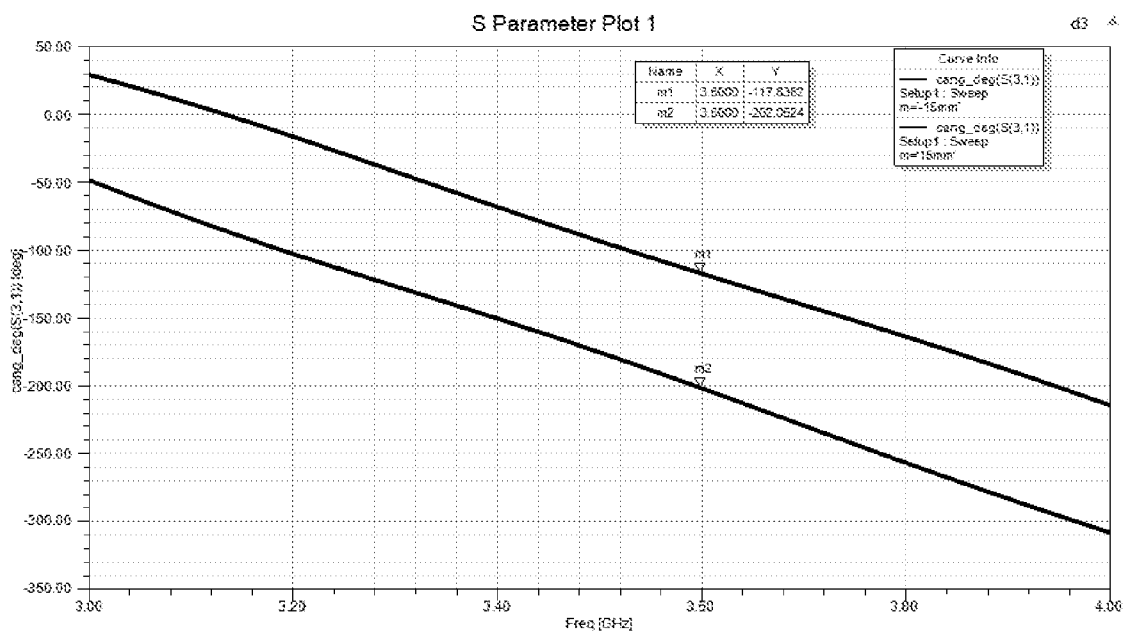
FIG. 12 is a schematic diagram of phase shift characteristics of different phase shift positions of a phase shifter provided by Embodiment V of the present disclosure from an input port 11 to an output port 13.
Figure 13:
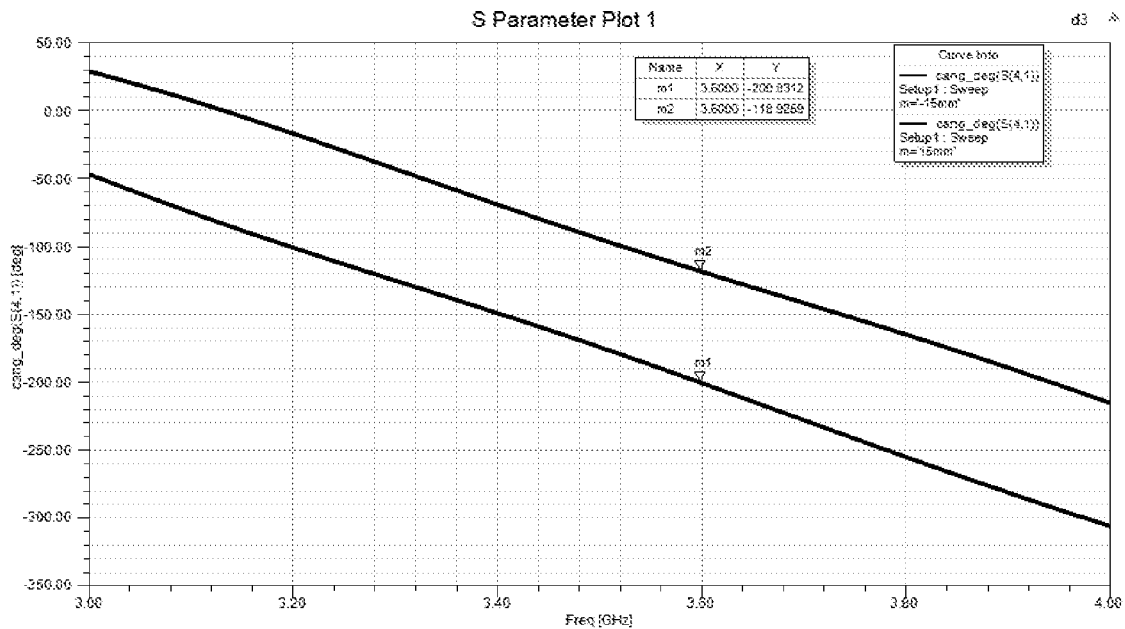
FIG. 13 is a schematic diagram of phase shift characteristics of different phase shift positions of a phase shifter provided by Embodiment V of the present disclosure from an input port 11 to an output port 14.
Figure 14:
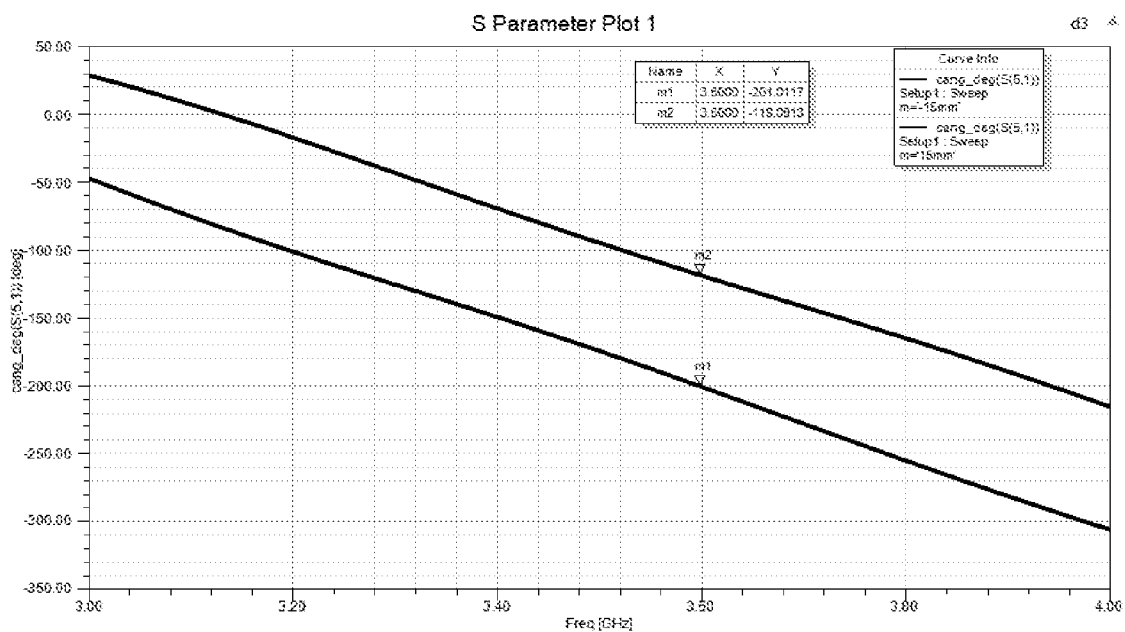
FIG. 14 is a schematic diagram of phase shift characteristics of different phase shift positions of a phase shifter provided by Embodiment V of the present disclosure from an input port 11 to an output port 15.

This embodiment takes a phase shifter made of a PCB as an example. Another phase shifter is provided. Referring to FIG. 7, the phase shifter is formed by pressing 5 layers of PCBs. The third layer of PCB 30 is attached with a feeder line 301. The feeder line 301 includes an input port 31 and branch output ports 32, 33, 34, 35. The second layer of supporting PCB 20 and the fourth layer of supporting PCB 40 are pressed on the upper and lower sides of the PCB 30. Region spaces of the feeder line 301 on the PCBs 20 and 40 are hollowed out to form hollowed-out regions (empty slots) 211 and 411. Dielectric pull rods 61 and 62 can slide synchronously in the hollowed-out regions 211 and 411. In the sliding process of the dielectric pull rods, an air medium and a pull rod medium are converted in upper and lower spaces of the line, so as to achieve a phase change effect. The standing-wave characteristics of the phase shifter may refer to FIG. 10. The first layer of PCB 10 and the fifth layer of PCB 50 are used for shielding. An input port 11 and branch output ports 12, 13, 14, 15 are arranged in the first layer of PCB 10. The input port 11 is connected to the input port 31 through a metal via, and the branch output ports 12, 13, 14, 15 are connected to the branch output ports 32, 33, 34, 35 through metal vias. Signals are input from the input port 11 and output from the branch output ports 12, 13, 14, 15. In a case where the dielectric pull rods 61, 62 move synchronously, the phases of the signals output by the branch output ports 12, 13, 14, and 15 have mirror image changes, and a differential ratio is 1:1:0:0 or 0:0:−1:−1. FIG. 11 to FIG. 14 respectively show variables of the phases.

The phase shifter in FIG. 7 can also be formed by pressing 3 layers of PCBs, that is, by pressing PCBs 20, 30, 40; Layers 10 and 50 are shielding layers, which can be composed of PCBs or metal sheets, and the whole phase shifter is formed in the later stage via surface-mounted welding or other processes.

Embodiment VI

Figure 8:
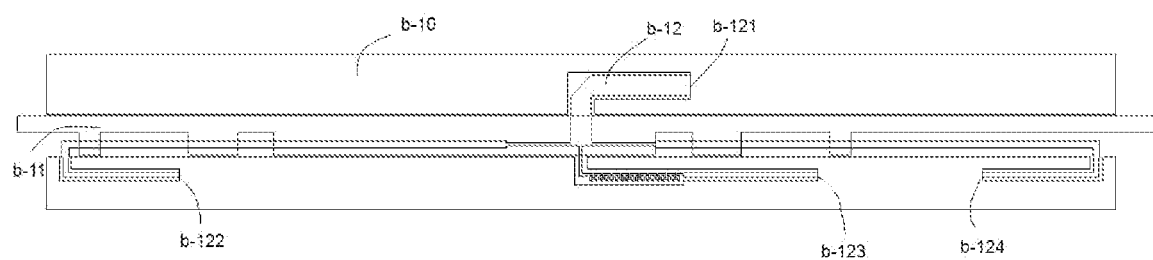
FIG. 8 is a top view of a phase shifter provided by an embodiment of the present disclosure.

FIG. 8 shows a top view of a main body of a one-to-three phase shifter. The stacking form is the same as that of Example I, and this figure does not show the upper and lower shielding layers. The main body of the phase shifter includes a dielectric supporting layer b-10, a one-in three-out feeder line b-12, and a dielectric pull rod b-11. The feeder line b-12 is provided with a signal input port b-121, and signal output ports b-122, b-123, b-124. A dielectric plate region of the feeder line b-12 mapped to the dielectric supporting layer b-10 is hollowed out, and the phase of each output port is changed during the sliding of the dielectric pull rod b-11. Signals are input from the input port b-121 and output from the output ports b-122, b-123, b-124. The dielectric pull rod b-11 translates left and right. As the medium changes, the differential ratio of the phase of each output port is 0:1:0:−1.

Embodiment VII

Figure 9:
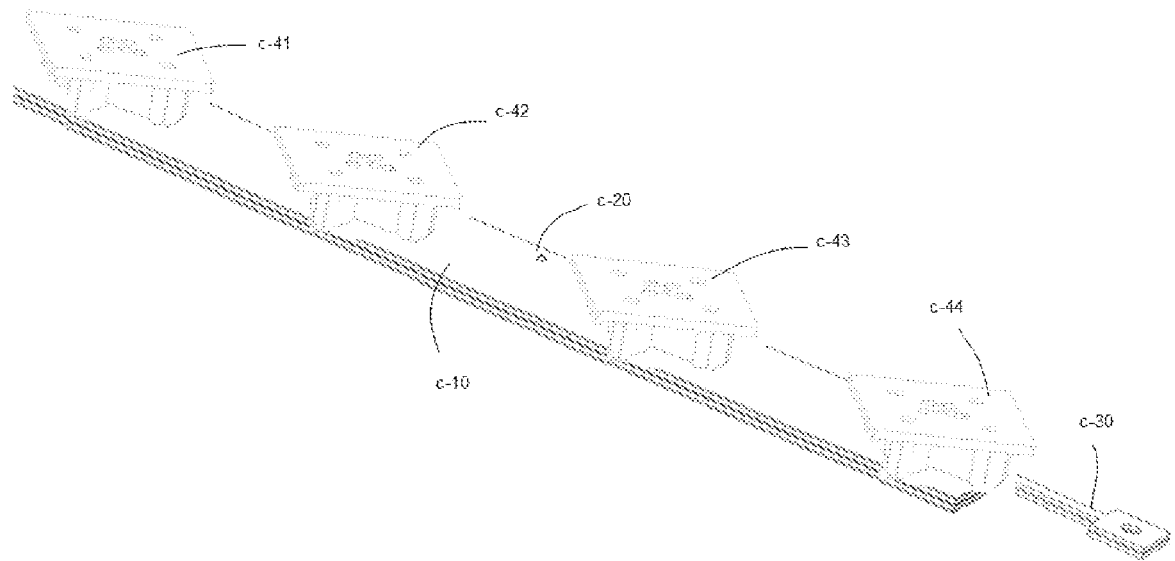
FIG. 9 is a schematic diagram of an electrically regulated antenna provided by an embodiment of the present disclosure.

FIG. 9 shows a three-dimensional top view of an electrically regulated antenna applying this phase shifter, where the phase shifter c-10 is the same as that of Example I. This figure shows a signal input port c-20 and a dielectric rod c-30, and also shows radiation units c-41, c-42, c-43, c-44. Compared with the phase shifter of the related art, the phase shifter of this embodiment has an outlet located on a surface of the phase shifter, so the radiation units can be directly welded to a surface of the phase shifter c-10 in a surface-mounted manner. Since compensation lines of the phase shifter are all integrated and shielded inside the phase shifter, there is no line on the surface of the antenna, and there is no surface wave that introduces interference to antenna beams, which reduces the coupling effect of the antenna. Since the phase shifter is formed by stacking and pressing multiple layers of PCBs, the strength of the phase shifter is high, and the antenna does not need a metal base plate as a support, which further reduces the weight of the antenna. The dielectric pull rod c-30 changes an input phase of each radiation unit during the sliding, and the radiation units c-41, c-42, c-43, c-44 form a fixed phase differential change, thereby realizing beam scanning. This example only shows a dual-channel electrically regulated antenna. In the application of a 5G electrically regulated antenna, a multi-channel antenna network can be replicated in a plane, which fully satisfies the application of the 5G electrically regulated antenna.

The phase shifter in the embodiment innovatively applies the stacking of the PCBs. In this way, the feeder line forming the phase shifter is arranged inside the PCB stack of the phase shifter, avoiding the interference of the surface waves of the antenna to the antenna beams, reducing the coupling of the antenna and increasing the performance of the antenna. In addition, the output end of the phase shifter of the embodiment of the present disclosure is on the surface of the phase shifter. By the use of the metal on the surface of the phase shifter, antenna array sub-units can be directly connected, thereby eliminating the application of the feeder line. This phase shifter can replicate and integrate multiple paths of phase shifting networks, which fully satisfies the application of the 5G electrically regulated antenna. Finally, since the phase shifter is formed by stacking the multiple layers of PCBs, the strength of the phase shifter is high and thus can avoid the use of the metal base plate, further reducing the weight of the antenna.

It can be seen that those having ordinary skill in the art should understand that all or some of the operations in the methods disclosed above and the functional modules/units in the system and the device can be implemented as software (which can be implemented by computer program codes executable by a computing device), firmware, hardware, and their appropriate combinations. In a hardware implementation mode, the division between the functional modules/units mentioned in the above description does not necessarily correspond to the division of physical components. For example, one physical component may have multiple functions, or one function or operation may be executed by the cooperation of several physical components. Some or all physical components may be implemented as software executed by a processor, such as a central processing unit, a digital signal processor or a microprocessor, or as hardware, or as an integrated circuit, such as an application specific integrated circuit.

In addition, communication media typically embody computer-readable instructions, data structures, computer program modules, or other data in a modulated data signal such as a carrier or other transport mechanisms, and can include any information delivery media, as is well known to those of ordinary skill in the art. Therefore, the present disclosure is not limited to any particular hardware and software combinations.

The above content is a detailed illustration made to the embodiments of the present disclosure in combination with the specific implementation modes, and cannot be considered that the specific implementation modes of the present disclosure are merely limited to these illustrations. Those having ordinary skill in the art can further make various simple deductions or substitutions without departing from the concept of the present disclosure, and these deductions or substitutions shall all fall within the protection scope of the present disclosure.

What is claimed is:

1. A phase shifter, comprising:
a shielding member, and an adjustable dielectric layer arranged in a shielding space formed by the shielding member, wherein
the adjustable dielectric layer comprises a line layer and a dielectric member; the line layer comprises a feed circuit and an empty slot arranged corresponding to the feed circuit and used to form an air strip line; the dielectric member is inserted into the empty slot; and a dielectric constant of the feed circuit is changed by controlling a depth of the dielectric member inserted into the empty slot;
wherein the line layer comprises a line carrying plate; the line carrying plate comprises two line setting surfaces; the line layer further comprises a first supporting plate and a second supporting plate which are respectively arranged on the two line setting surfaces; a through slot matched with a shape of the feed circuit formed on the line setting surface corresponding to the first supporting plate and/or the second supporting plate is formed in the first supporting plate and/or the second supporting plate, so that when the carrying plate is fitted to the first supporting plate and/or the second supporting plate, the feed circuit is embedded into the through slot.

2. The phase shifter according to claim 1, wherein the first supporting plate is provided with a first empty slot used to form a first air strip line, and the second supporting plate is provided with a second empty slot used to form a second air strip line.

3. The phase shifter according to claim 2, wherein the dielectric member comprises a first dielectric pull rod used to be inserted into the first empty slot and a second dielectric pull rod used to be inserted into the second empty slot; the first dielectric pull rod and the second dielectric pull rod are the same in shape, and the shape is related to a differential ratio of a phase change of an output signal of the phase shifter.

4. The phase shifter according to claim 3, wherein a first operation end, which is located outside the first empty slot, of the first dielectric pull rod and a second operation end, which is located outside the second empty slot, of the second dielectric pull rod are located at a same end and synchronously move during insertion and withdrawal.

5. The phase shifter according to claim 4, wherein the first dielectric pull rod and the second dielectric pull rod each comprise a front-end insertion section and a rear-end operation end, and the rear-end operation ends of the first dielectric pull rod and the second dielectric pull rod are fixed together to achieve the synchronous movement.

6. The phase shifter according to claim 4, wherein the first dielectric pull rod and the second dielectric pull rod each comprise a front-end insertion section and a rear-end operation end, a first open hole and a second open hole are respectively formed in the rear-end operation ends of the first dielectric pull rod and the second dielectric pull rod, and the first open hole and the second open hole are fixed together through a bolt for synchronous movement.

7. The phase shifter according to claim 1, wherein the shielding member is a shielding housing forming the shielding space; a lead wire through hole is formed in a housing surface, parallel to a plane where the feed circuit is located, on the shielding housing;
and the lead wire through hole is connected to a pin of the feed circuit.

8. The phase shifter according to claim 7, wherein a position of the lead wire through hole is set corresponding to an input pin and an output pin of the feed circuit.

9. An electrically regulated antenna, comprising at least one radiation unit and the phase shifter according to claim 7, wherein
the radiation unit is connected to the feed circuit inside the phase shifter through a lead wire hole of the phase shifter;
the phase shifter changes a phase of an output signal by controlling a depth of a dielectric member inserted into an empty slot and transmits, through the radiation unit, the output signal after the change of the phase.

10. The phase shifter according to claim 1, wherein the shielding member comprises a first shielding plate and a second shielding plate which are made of metal plates or printed circuit boards (PCBs), and the first shielding plate and the second shielding plate form the shielding space.

11. The phase shifter according to claim 10, wherein the line carrying plate, the first supporting plate, and the second supporting plate are PCBs;
in a case where the first shielding plate and the second shielding plate are PCBs, the line carrying plate, the first supporting plate, the second supporting plate, the first shielding plate, and the second shielding plate are pressed to each other to form the phase shifter;
in a case where the first shielding plate and the second shielding plate are metal plates, the line carrying plate, the first supporting plate and the second supporting plate are pressed to each other, and the first shielding plate and the second shielding plate are respectively fixed on the first supporting plate and the second supporting plate to form the phase shifter.

12. An electrically regulated antenna, comprising at least one radiation unit and the phase shifter according to claim 1, wherein
the radiation unit is connected to the feed circuit inside the phase shifter through a lead wire hole of the phase shifter;
the phase shifter changes a phase of an output signal by controlling a depth of a dielectric member inserted into an empty slot and transmits, through the radiation unit, the output signal after the change of the phase.

13. The electrically regulated antenna according to claim 12, wherein the radiation unit is fixed on the shielding member of the phase shifter.

14. A network device, comprising a processor, a communication bus, and the electrically regulated antenna according to claim 10, wherein
the electrically regulated antenna is configured to change a phase of an output signal and transmit the output signal after the change of the phase;
the communication bus is configured to implement connection and communication between the processor and the electrically regulated antenna;
the processor is configured to control the electrically regulated antenna to change the phase of the output signal.

15. A phase shifter manufacturing method, comprising:
etching a setting surface, provided with a feed circuit, on a printed circuit board (PCB) substrate to form a groove that has a same shape as that of the feed circuit, and respectively etching two setting surfaces of the PCB substrate to form empty slots used to accommodate dielectric members;
attaching the feed circuit in the etched groove; and
respectively adhering and fixing metal plates or PCBs on the two setting surfaces of the PCB substrate, forming a run-through lead wire through hole in a position corresponding to the groove, and connecting the lead wire through hole to a corresponding pin of the feed circuit; and
respectively inserting the dielectric members into the etched empty slots on the two setting surfaces of the PCB substrate.

16. A phase shifter manufacturing method, comprising:
providing a first supporting printed circuit board (PCB), a second supporting PCB, a line carrying PCB, a first shielding plate, and a second shielding plate, wherein the first shielding plate and the second shielding plate are metal plates or PCBs;
arranging a feed circuit on at least one setting surface of the line carrying PCB;
forming through slots that have the same shapes as that of the feed circuit and empty slots used to accommodate dielectric members in the first supporting PCB and the second supporting PCB;
forming lead wire through holes in positions, corresponding to the through slots on the first supporting PCB and the second supporting PCB, on the first shielding plate and the second shielding plate;
pressing and fixing the first supporting PCB, the second supporting PCB, the line carrying PCB, the first shielding plate, and the second shielding plate together; and
respectively inserting the dielectric members into the empty slots in the first supporting PCB and the second supporting PCB.

* * * * *